United States Patent
Watanabe

(10) Patent No.: US 8,668,787 B2
(45) Date of Patent: Mar. 11, 2014

(54) SILVER ALLOY, SPUTTERING TARGET MATERIAL THEREOF, AND THIN FILM THEREOF

(75) Inventor: Atsushi Watanabe, Tokyo (JP)

(73) Assignee: Furuya Metal Co., Ltd., Tokyo (JP)

(*) Notice: Subject to any disclaimer, the term of this patent is extended or adjusted under 35 U.S.C. 154(b) by 649 days.

(21) Appl. No.: 12/882,413

(22) Filed: Sep. 15, 2010

(65) Prior Publication Data

US 2011/0003173 A1    Jan. 6, 2011

Related U.S. Application Data

(63) Continuation of application No. 10/573,470, filed as application No. PCT/JP2004/010508 on Jul. 23, 2004, now abandoned.

(30) Foreign Application Priority Data

| Sep. 26, 2003 | (JP) | 2003-335760 |
| Apr. 15, 2004 | (JP) | 2004-120080 |

(51) Int. Cl.
*C23C 14/34* (2006.01)
*C22C 5/06* (2006.01)

(52) U.S. Cl.
USPC ........... 148/430; 148/431; 420/501; 420/502; 420/503; 420/504; 428/64.1; 369/275.1; 369/275.2

(58) Field of Classification Search
USPC .......... 148/430–431; 420/501–504; 428/64.1; 369/275, 275.2, 275.1
See application file for complete search history.

(56) References Cited

U.S. PATENT DOCUMENTS 4,330,331 A    5/1982   Fujiwara et al.

FOREIGN PATENT DOCUMENTS

| JP | 05-341066    | 12/1993 |
| JP | 9-183181     | 7/1997  |
| JP | 10-282907    | 10/1998 |
| JP | 11-260269    | 9/1999  |
| JP | 2000-109943  | 4/2000  |
| JP | 2001-324713  | 11/2001 |
| JP | 2002-332568  | 11/2002 |
| JP | 2002-350840  | 12/2002 |
| JP | 2003-193155  | 7/2003  |
| JP | 2003-208801  | 7/2003  |

OTHER PUBLICATIONS

Office Action issued Oct. 5, 2010, in Japan Patent Application No. 2005-514158.

*Primary Examiner* — Sikyin Ip
(74) *Attorney, Agent, or Firm* — Oblon, Spivak, McClelland, Maier & Neustadt, L.L.P.

(57) ABSTRACT

It is an object of the present invention to provide a Ag—Pd—Cu—Ge type silver alloy which can form a reflective electrode film having such two characteristics that it is very reduced in the lowering of reflectance caused by thermal deterioration and has resistant to yellowing caused by sulfurization even after a heating step in a process of producing a color liquid crystal display. The silver alloy according to the present invention includes a composition containing at least four elements including Ag as its major component, 0.10 to 2.89 wt % of Pd, 0.10 to 2.89 wt % of Cu and 0.01 to 1.50 wt % of Ge, and the total amount of Pd, Cu and Ge is 0.21 to 3.00 wt %.

24 Claims, 11 Drawing Sheets

Ag - Pd - Cu - Ge

Heater or high frequency coil

Mold

Pedestal

Ag - Pd - Cu - Ge

Mold

Water-cooled Hearth

SILVER ALLOY, SPUTTERING TARGET MATERIAL THEREOF, AND THIN FILM THEREOF

This application is a continuation of U.S. application Ser. No. 10/573,470, filed Jan. 11, 2007, now abandoned, which is a 371 of application PCT/JP2004/010508, filed Jul. 23, 2004, which claims the benefit of priority from Japanese Patent Application No. 2003-335760, filed Sep. 26, 2003, and Japanese Patent Application No. 2004-120080, filed Apr. 15, 2004, all incorporated herein by reference.

TECHNICAL FIELD

The present invention relates to a silver alloy superior in heat resistance and resistance to sulfurization, to a sputtering target material having the composition of the silver alloy and to a thin film or a paste of the silver alloy. Also, the silver alloy thin film is adaptable to various uses, for example, displays such as liquid crystal displays or a reflecting film, reflecting electrode film, electrode film or wiring of electronic parts such as LEDs (emitting diode). The silver alloy thin film is also adaptable to uses for a reflecting film and thin semi-transmissive film of optical disk mediums or reflecting films of light parts such as headlights and projection lamps of projectors and may also be used as an electromagnetic wave shielding film.

BACKGROUND ART

It is demanded of the reflecting electrode film of a color liquid crystal display to have heat resistance enough to stand against heating because it is heated to about 250° C. in the heating step for assembling a color filter in the production of a color liquid crystal display and the like. Al and alloys containing Al as a major component have been used as the reflecting electrode film, and silver alloys are being examined as the reflecting electrode film material with expectation of a high reflectance and low electric resistance.

The applicant of the invention has disclosed a Ag (silver)-Pd (palladium)-Cu (copper) type silver alloy as the silver alloy suitable to a reflecting electrode film and a reflecting wiring electrode film (see Patent References 1 to 3).

Patent Reference 1: Japanese Patent Application Laid-Open (JP-A) No. 2000-109943, Claim 4.

Patent Reference 2: JP-A No. 2001-192752, Claim 1.

Patent Reference 3: f JP-A No. 2001-226765, Claim 2.

The Ag—Pd—Cu type silver alloys described in the above Patent references 1 to 3 are more improved in weatherability than pure silver. A reflecting electrode film made of a Ag—Pd—Cu type silver alloy gave rise to the growth of surface roughness and generation of hillocks though these phenomena occurred not a few, causing dropped reflectance as described later. Also, sulfurization is promoted by heating and the resistance of the alloy to the sulfurization has been improved only insufficiently. Along with the sulfurization of the Ag—Pd—Cu type silver alloy, yellowing of the reflecting electrode film has been caused, bringing about a reduction in the luminance of a color liquid crystal display. This is the reason why there has been a great need to find a silver alloy having a higher performance, specifically, higher heat resistance and high resistance to sulfurization that have not been obtained so far.

In the meantime, an invention is disclosed in which Ge (germanium) is compounded in a Ag—Pd type silver alloy for a reflecting film of an optical recording medium such as CD-ROMs that are not processed in a heating step when a color liquid crystal display is produced (see, for example, Patent Reference 4). Here, Ge is assumed in the invention to have an effect of improving the weatherability of a silver alloy, specifically, the effect of preventing the lowering of reflectance caused by long-term use of the reflecting film.

Patent Reference 4: JP-A No. 2003-193155, Claim 1.

DISCLOSURE OF THE INVENTION

It is an object of the present invention to provide a Ag—Pd—Cu—Ge type silver alloy which can form a reflecting electrode film having a combination of such two characteristics that it is very reduced in the lowering of reflectance caused by thermal deterioration and is resistant to yellowing caused by sulfurization even after a heating step at a temperature of 250°, for example, the above described heating step in a process of producing a color liquid crystal display.

It is another object of the present invention to provide a sputtering target material of the silver alloy, a thin film of the silver alloy and a paste of the silver alloy as to the form of the Ag—Pd—Cu—Ge type silver alloy.

It is a further object of the present invention to utilize the Ag—Pd—Cu—Ge type silver alloy as a reflecting film, wiring, electrodes or reflecting electrodes by forming a thin film of the Ag—Pd—Cu—Ge type silver alloy, and to provide a self-emitting type display and a flat panel display provided with a reflecting film, a perforated type semi-transmissive film, wiring, electrodes and reflecting electrodes which respectively comprise a Ag—Pd—Cu—Ge type silver alloy. In the uses of the Ag—Pd—Cu—Ge type silver alloy for displays, a drop in the reflectance of the Ag—Pd—Cu—Ge type silver alloy thin film and sulfurization are small and it is therefore possible to raise luminance. Also, along with improved weatherability, it is an even further object of the present invention to utilize the silver alloy thin film of the present invention as reflecting films and thin semi-transmissive films of optical disk mediums and reflecting film of light parts such as head lamps or projector lamps, or it is an even further object of the present invention to utilize the silver alloy thin film of the present invention as a reflecting film, wiring, electrode or reflecting electrode of electronic parts such as LEDs. Also, it is an even further object of the present invention to utilize the silver alloy thin film according to the present invention as an electromagnetic shielding film.

The inventors of the present invention have made earnest studies concerning the composition of a silver alloy to develop a silver alloy superior in heat resistance and resistance to sulfurization and, as a result, found that high heat resistance is obtained by the synergetic action of Cu and Ge and resistance to sulfurization is obtained by the action of Ge when Cu and Ge are made to be present simultaneously with the Ag—Pd alloy, to complete the present invention. Accordingly, a silver alloy according to the present invention includes a composition containing at least four elements including Ag as its major component, 0.10 to 2.89 wt % of Pd, 0.10 to 2.89 wt % of Cu and 0.01 to 1.50 wt % of Ge, provided that the total amount of Pd, Cu and Ge is 0.21 to 3.00 wt %. Here, the silver alloy according to the present invention preferably has a composition excluding any component other than the four elements wherein the content of Ag is 97.00 to 99.79 wt %. Moreover, the ratio of the content of Cu to the content of Ge, namely, Cu content/Ge content is preferably designed to be (1/20) to (20/1).

A silver alloy sputtering target material according to the present invention is characterized by its composition formed of the above silver alloy.

Also, a silver alloy thin film according to the present invention is characterized by its composition formed of the above silver alloy.

The silver alloy or silver alloy thin film according to the present invention involves the case where it has a reflectance of 90% or more for light having a wavelength of 550 nm after heat-treated at 250° C. for one hour in the air.

The silver alloy or silver alloy thin film according to the present invention involves the case where it has a reflectance of 75% or more for light having a wavelength of 550 nm after exposed to a 100 ppm hydrogen sulfide atmosphere at ambient temperature for 48 hours.

The silver alloy or silver alloy thin film according to the present invention involves the case where it has a reflectance of 88% or more for light having a wavelength of 550 nm after exposed to a high temperature and high humidity atmosphere of 85° C. and 90 RH % for 200 hours.

The silver alloy thin film according to the present invention involves the case where it is a reflecting film, a thin type semi-transmissive film, a perforated type semi-transmissive film or a patterned electrode or wiring. These reflecting film, thin type semi-transmissive film, perforated type semi-transmissive film and a patterned electrode or wiring involve the case where they are structural members for a self-emitting type display or a flat panel display and the case where they are quartz oscillator electrodes. Also, the above reflecting film, wiring, electrode or reflecting electrode involves the case where they are structural members for electronic parts such as LEDs. Also, the silver alloy thin film according to the present invention involves the case where it is an electromagnetic shielding film that highly reflects electromagnetic waves.

Moreover, the present invention covers a self-emitting type display and a flat panel display provided with the reflecting film or perforated semi-transmissive film according to the present invention. The present invention also covers a mirror of light parts of a headlight or a projector lamp including the reflecting film. Moreover, the present invention covers an optical disk medium provided with at least one of the reflecting film and thin type semi-transmissive film according to the present invention. Here, the self-emitting type display includes an organic EL display, inorganic EL display, SED (surface conduction electron emitter display or a surface conduction type electron emitting display) and FED (field emission display). The flat panel display includes a liquid crystal display, PDP (plasma display panel), TFT (Thin Film Transistor) and C-STN (Color Super Twisted Nematic). Examples of the optical disk medium include a DVD-R, DVD-RW, DVD-RAM, HD-DVD, BD-R, BD-RE and BD-ROM. Examples of the form of the headlight parts include a reflecting film located behind the emitting part. Examples of the projector include a projecting reflecting mirror. Examples of the mirror of lamp parts include reflecting bodies (optical pickup mirrors and optical communication mirrors).

EFFECT OF THE INVENTION

The silver alloy of the present invention exhibits high heat resistance by the synergetic action of Cu and Ge and high resistance to sulfurization by the presence of Ge. The silver alloy consequently has excellent heat resistance and high resistance to sulfurization at the same time. Therefore, when the silver alloy is made into a reflecting electrode film, the obtained reflecting electrode film is very reduced in the lowering of reflectance caused by thermal deterioration and has resistance to yellowing caused by sulfurization even if it is processed through a heating step in a process of producing a flat display such as a color liquid crystal display or in a process of producing a self-emitting type display such as an organic EL and inorganic EL or LED. Also, because the silver alloy is improved in weatherability, the silver alloy thin film according to the present invention may be utilized as reflecting films of optical disk mediums, thin type semi-transmissive films, the structural members of electronic parts such as LEDs and as reflecting films of light parts such as a headlamp and projector lamp. Also, the silver alloy thin film may be utilized as an electromagnetic shielding film. The silver alloy thin film according to the present invention may be utilized a silver alloy paste.

BEST MODE FOR CARRYING OUT THE INVENTION

Figure 1:
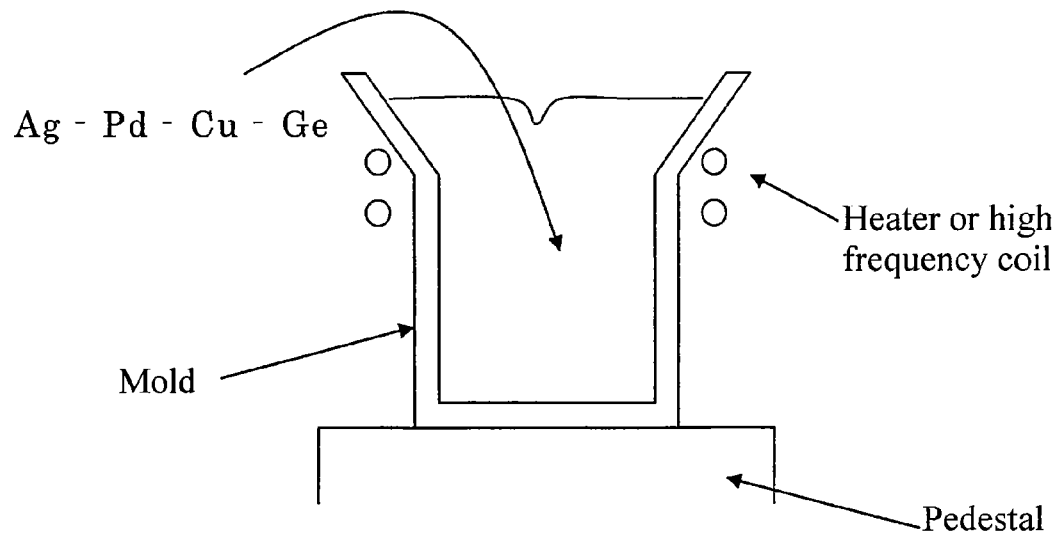
FIG. 1 is a schematic view showing one embodiment of a mold into which a silver alloy is tilt-poured and showing the case of heating the upper part of the mold.

The present invention will be explained in detail by way of embodiments. However, the present invention is not interpreted to be limited to these descriptions.

A silver alloy according to this embodiment has a composition that contains Ag as its major component and includes at least 4 elements consisting of Ag, Pd, Cu and Ge. The silver alloy according to this embodiment uses Ag as its major component. This reason is that, when it is used as a reflecting electrode film material, it is expected that the reflecting electrode film material will have a higher reflectance and a lower electric resistance as compared with the case of using Al or an Al alloy. The silver alloy according to this embodiment preferably has a basic composition consisting of four elements of a Ag—Pd—Cu—Ge system, wherein the content of Ag in the silver alloy is designed to be 97.00 to 99.79 wt %. It is to be noted that the reason why the silver alloy is designed to have a composition consisting of at least four elements is that though the basic composition of the silver alloy is a Ag—Pd—Cu—Ge system, a fifth element may be added to the silver alloy to the extent that the effect of the present invention.

In the silver alloy according to this embodiment, the content of Pd is designed to be 0.10 to 2.89 wt % and preferably 0.5 to 2.0 wt %. When Pd is added, Pd can be dispersed in and penetrated into the grain boundary of Ag whereby the inferior weatherability given by Ag under a high temperature and high humidity circumstance is improved. When the content of Pd is less than 0.10 wt %, the effect of improving the weatherability can be scarcely produced. When the content of Pd exceeds 2.89 wt % on the other hand, the content of Ag is resultantly made smaller from the necessity of addition of Cu and Ge and therefore a reduction in the original reflectance is observed.

In the silver alloy according to this embodiment, the content of Cu is designed to be 0.10 to 2.89 wt % and preferably 0.20 to 2.0 wt %. Simple addition of Pd to Ag causes the growth of surface roughness due to aggregation and occurrence of hillocks which are seen significantly when the silver alloy is processed through a heating step performed, for example, at 250° C. for about one hour as will be explained in Comparative Examples later. Therefore, the content of Pd is limited to the above range and Cu is contained as a third element in the silver alloy in an amount of 0.10 to 2.89 wt %. When the content of Cu is less than 0.10 wt %, the effect of improving resistance to hillocks is scarcely produced. On the other hand, when the content of Cu exceeds 2.89 wt %, the content of Ag is resultantly made smaller from the necessity of addition of Pd and Ge and therefore a reduction in the original reflectance is observed.

In the silver alloy according to this embodiment, the content of Ge is designed to be 0.01 to 1.50 wt % and preferably 0.05 to 1.0 wt %. A simple Ag—Pd—Cu system silver alloy somewhat gives rise to the growth of surface roughness due to aggregation and occurrence of hillocks when the silver alloy is processed through a heating step performed, for example, at 250° C. for about one hour, leading to reduced reflectance as will be explained in Comparative Examples later. In addition, because sulfurization is promoted by heating and only insufficient improvement in sulfurization has been made, the sulfurization of the Ag—Pd—Cu system silver alloy is associated with yellowing of the reflecting electrode film, bringing about a drop in the luminance of a color liquid crystal display. To deal with this, 0.01 to 1.50 wt % of Ge is added as a fourth element to the silver alloy to improve resistance to sulfurization and also to improve heat resistance by the synergetic action of Cu and Ge. When the content of Ge is less than 0.01 wt %, an improvement in heat resistance and resistance to sulfurization is scarcely made. When the content of Ge exceeds 1.50 wt % on the other hand, the content of Ag is resultantly made smaller from the necessity of addition of two elements, Pd and Cu and therefore a reduction in the original reflectance, a reduction in weatherability and an increase in electric resistance are observed.

In the silver alloy according to this embodiment, the total content of Pd, Cu and Ge is preferably designed to be 0.21 to 3.00 wt %. When the total content of Pd, Cu and Ge is less than 0.21 wt %, only unsatisfactory weatherability, heat resistance and resistance to sulfurization are obtained since the content of Pd, Cu and Ge is small. When the total content of Pd, Cu and Ge exceeds 3.00 wt %, the original reflectance of silver is not exhibited and an increase in electric resistance is observed.

Moreover, in the silver alloy according to this embodiment, the ratio of the content of Cu to the content of Ge, namely, Cu content/Ge content is preferably designed to be (1/20) to (20/1). As will be explained in Examples, the addition of Cu and Ge to Ag—Pd attains restrictions to the growth of columnar grains and sulfurization after heat treatment, which restrictions cannot be obtained by the addition of Cu or Ge. This is attained by making Cu and Ge coexist. Therefore, in order for Cu and Ge to produce the effect obtained by coexistence of the both and to sufficiently restrict the growth of columnar grains after heat treatment in the Ag—Pd—Cu—Ge system silver alloy, Cu content/Ge content is preferably in a range from (1/20) to (20/1).

The silver alloy according to this embodiment may be made into the form of a silver alloy sputtering target material or a silver alloy paste used to produce a silver alloy thin film. Also, the application of the silver alloy according to this embodiment is as jewelry materials.

When the silver alloy or silver alloy thin film according to this embodiment is made to have the above composition, it has a reflectance of, preferably, 90% or more for light having a wavelength of 550 nm after it is heat-treated at 250° C. for one hour in the air. Also, the reflectance of the silver alloy or silver alloy thin film according to this embodiment for light having a wavelength of 550 nm after it is exposed to a 100 ppm hydrogen sulfide atmosphere at ambient temperature for 48 hours is preferably 75% or more. Also, the reflectance of the silver alloy or silver alloy thin film according to this embodiment for light having a wavelength of 550 nm after it is exposed to a high temperature and high humidity atmosphere of 85° C. and 90 RH % for 200 hours is preferably 88% or more.

Next, explanations will be explained as to a method of producing the silver alloy sputtering target material by using the silver alloy according to this embodiment.

Each bare metal of Ag, Pd, Cu and Ge is weighed and poured into a crucible. At this time, as the crucible, one reduced in oxygen content such as a carbonaceous crucible is selected. Or, an alumina crucible or a magnesia crucible may be used. When a carbonaceous crucible is selected, it can be treated by high frequency heating. Therefore, the carbonaceous crucible charged with each bare metal is placed in a high-frequency melting furnace and the furnace is vacuumed. At this time, the pressure in the furnace is set to 1.33 Pa or less. Then, the atmosphere of the melting chamber is substituted with Ar ($1.33 \times 10^4$ to $8.0 \times 10^4$ Pa) to start melting. The melting temperature is set to 1050 to 1400° C. At this time, the content of Ag is designed to be 97.00 to 99.79 wt %, the content of Pd is designed to be 0.10 to 2.89 wt %, the content of Cu is designed to be 0.10 to 2.89 wt %, the content of Ge is designed to be 0.01 to 1.50 wt %, the total content of Pd, Cu and Ge is designed to be 0.21 to 3.00 wt % and the ratio of the content of Cu to the content of Ge, namely Cu content/Ge content is designed to be (1/20) to (20/1) in the composition, to melt these components.

Figure 2:
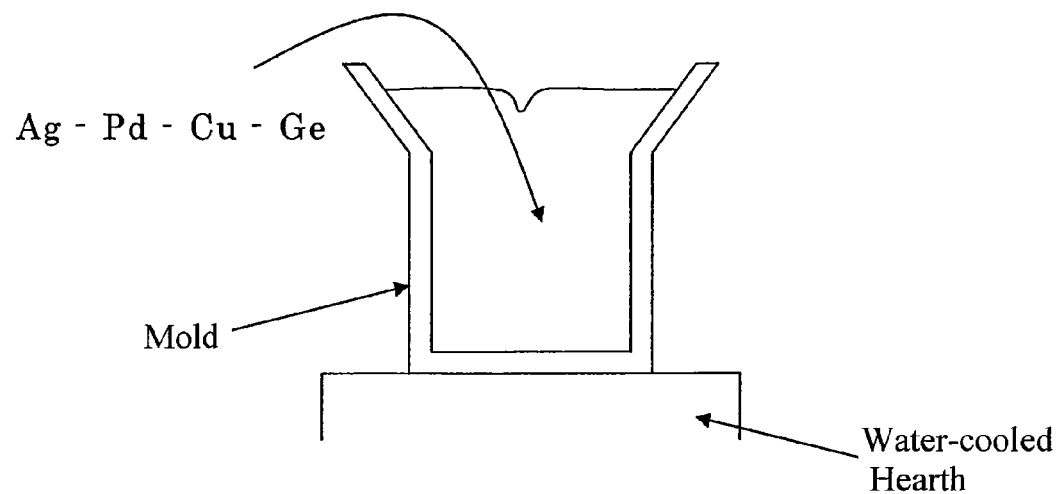
FIG. 2 is a schematic view showing a second embodiment of a mold into which a silver alloy is tilt-poured and showing the case of cooling the lower part of the mold.
Figure 3:
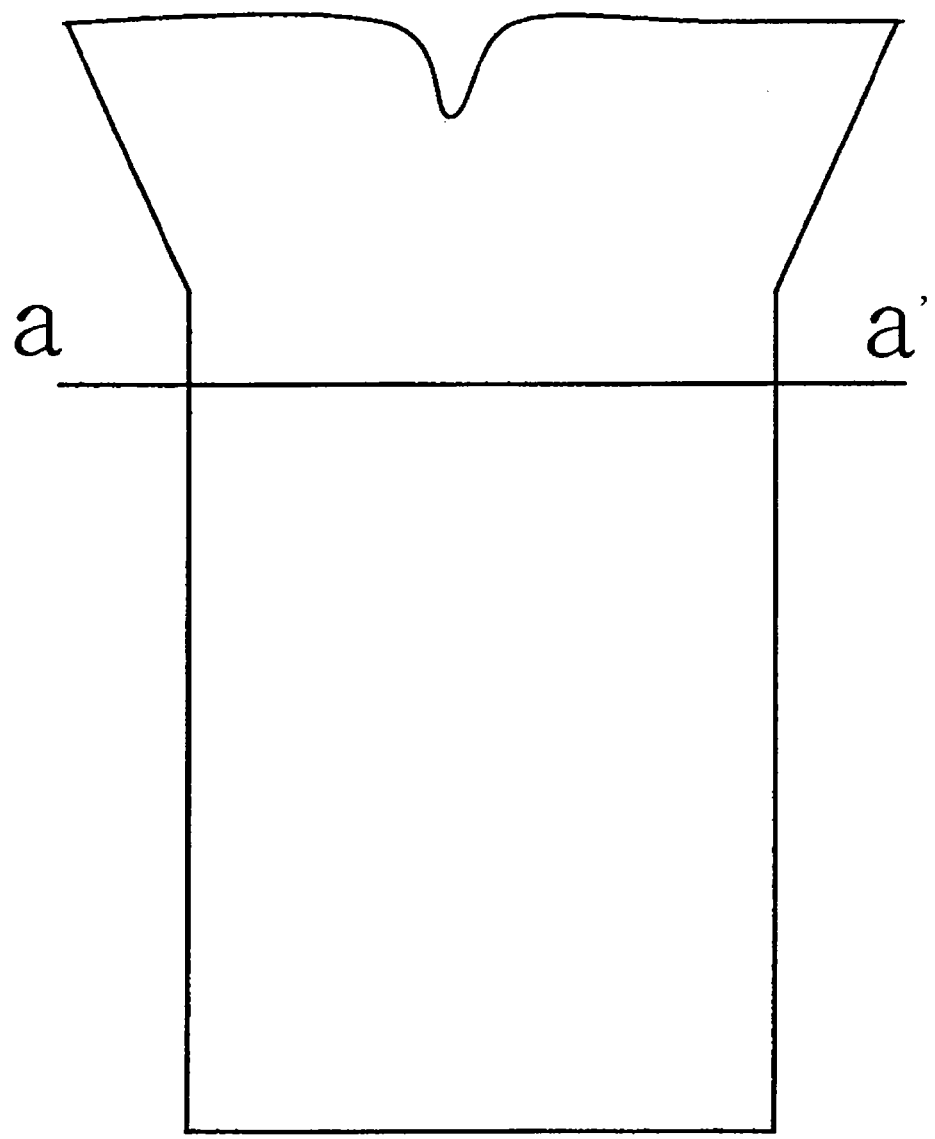
FIG. 3 is a schematic view showing one embodiment of a cut line (a-a' line) of a sink head portion in a cooled ingot.

After the molten state is stabilized, the molten material is tilt-poured into a mold to produce an ingot. As to the type of mold, an iron mold and alumina mold as well as a carbonaceous mold reduced in oxygen content may be used. The upper part of the mold is heated as shown in FIG. 1 or the lower part of the mold is cooled as shown in FIG. 2 to make it easy to emit the gas from the mold. When the upper part of the mold is heated as shown in FIG. 1, resistance type heating or heating using a high-frequency coil is carried out. After the ingot is cooled to normal temperature, it is cut along the line a-a' at the upper part (sink head portion) thereof as shown in FIG. 3.

The ingot is heat-treated at 600 to 900° C., followed by hot-forging and rolling. The ingot is annealed during rolling. The annealing is carried out both when the thickness of the ingot is not less than twice that of a product and in the final stage. The annealing temperature was designed to be 300 to 700° C. to get minute and uniform crystal particles. The annealing is preferably carried out under vacuum or in an inert gas atmosphere. Then, a press machine and a leveler are used to amend warpage.

The surface and the outside periphery of the resulting ingot are cut by a lathe or a miller to make the ingot into a product form. The entire surface of the product may be polished. The surface roughness of the product is adjusted and thus the Ag alloy sputtering target material of the present invention can be produced finally.

Even in the case of adding Pd, Cu and Ge to Ag and melting them when the silver alloy sputtering target material of this embodiment is produced as mentioned above, easy methods that are currently used may also be applied, which has a large merit in view of cost and production process.

Explanations will be explained as to a method of producing a silver alloy thin film according to this embodiment. The silver alloy thin film according to this embodiment is obtained by forming a film of the above silver alloy sputtering target material according to a sputtering method. Also, the above four elements may be divided into plural targets, which are sputtered simultaneously, to form a film so as to make a composition of the silver alloy according to this embodiment by controlling the discharge amount of each element.

When the silver alloy thin film according to this embodiment is formed, an adhesive layer may be optionally formed between the substrate and the thin film. In this case, Si, Ta, Ti, Mo, Cr, Al, ITO, ZnO, $SiO_2$, $TiO_2$, $Ta_2O_5$ or $ZrO_2$ is desirable as the material of an adhesiveness promoting undercoat of various types of glass substrates.

The four-element type silver alloy according to this embodiment has the same electric resistance as a three-element (Ag—Pd—Cu) type.

The silver alloy thin film according to this embodiment is superior in weatherability, heat resistance and resistance to sulfurization and is used in applications ranging from (1) reflecting electrode films, reflecting films or perforated type semi-transmissive films of, for example, self-emitting type displays and flat panel displays, (2) wiring, (3) reflecting films and thin type semi-transmissive films of optical disk mediums, (4) electromagnetic shielding films, (5) reflecting films, wiring and electrode films of electronic parts such as LEDs, (6) mirrors of light parts such as head lamps and projector lamps and (7) building materials of glass. The silver alloy thin film according to the present invention includes the case where it is a thin type semi-transmissive film. The semi-transmissive film is obtained not only when the film thickness is as thin as 1 to 50 nm but also when the film is made into a perforated type semi-transmissive film in which light transmissive holes that transmit a part of incident light is form even if the film thickness exceeds 50 nm. The thin type semi-transmissive film is formed is used mainly for optical disk mediums whereas the perforated type semi-transmissive film in which light transmissive holes is used mainly for self-emitting type displays and flat panel displays or reflecting electrodes. The optical disk medium is sometimes provided with at least one of a reflecting film and thin type semi-transmissive film. Moreover, the silver alloy thin film according to this embodiment may be widely utilized as electronic parts. The silver alloy thin film can be used as circuit parts including electrodes of, for example, resistors or condensers, as contacts of, for example, switches, communication/network units, filters, fuses, thermistors, oscillator/resonator, varistors, print wiring for print wiring boards, electrodes for power source units, wiring for power source circuit parts and electrodes of integrated circuits and ICs. The silver alloy thin film according to this embodiment can also be widely utilized as optical parts, sensors, display parts and I/O (input/output). The silver alloy thin film according to this embodiment may be used as, for example, reflecting films such as optical parts and as contacts of input/output units.

EXAMPLES

Example 1

Figure 4:
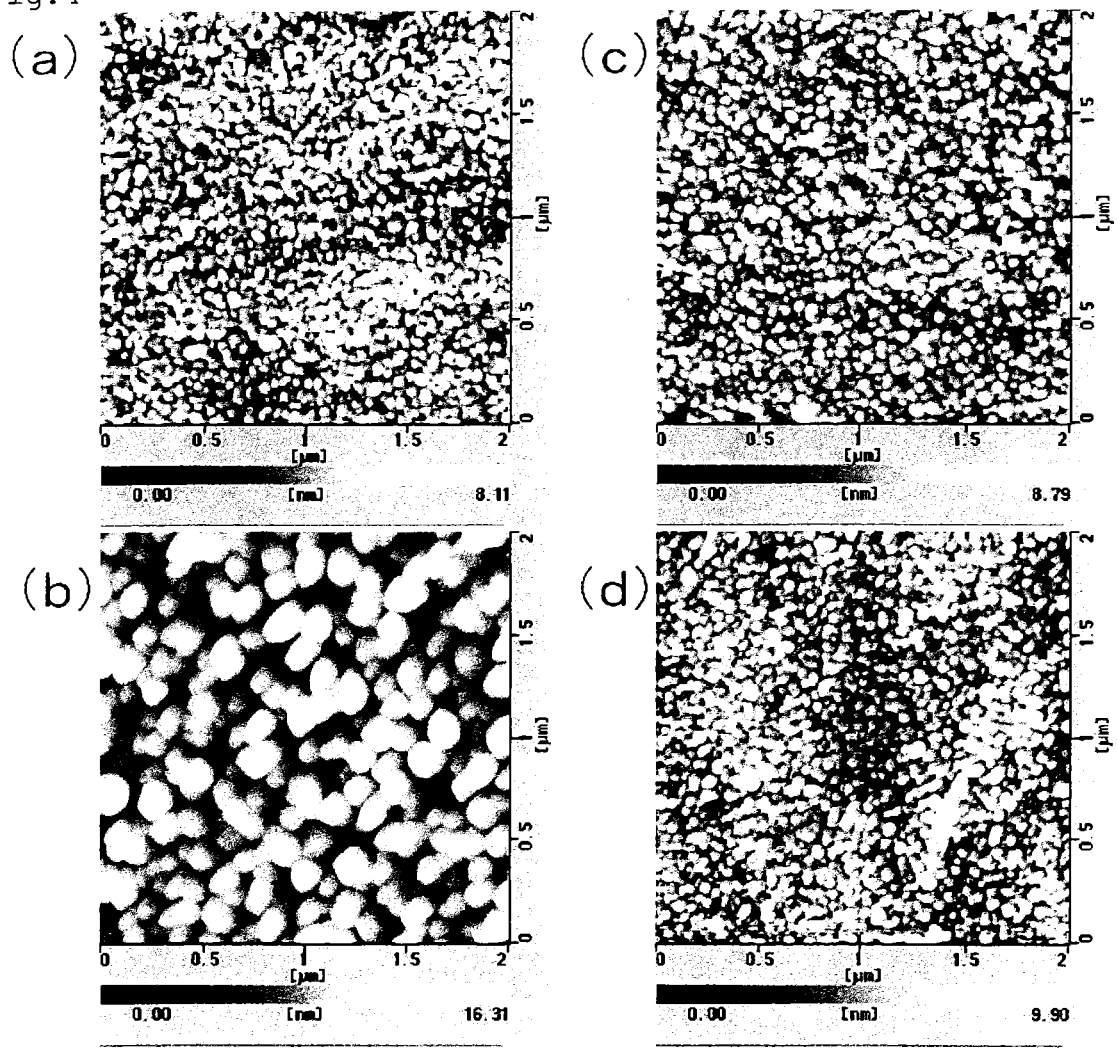
FIG. 4 is a AFM image of a silver alloy thin film after the film is formed: (a) shows Example 1, (b) shows Comparative Example 1, (c) shows Comparative Example 3 and (d) shows Comparative Example 5.
Figure 5:
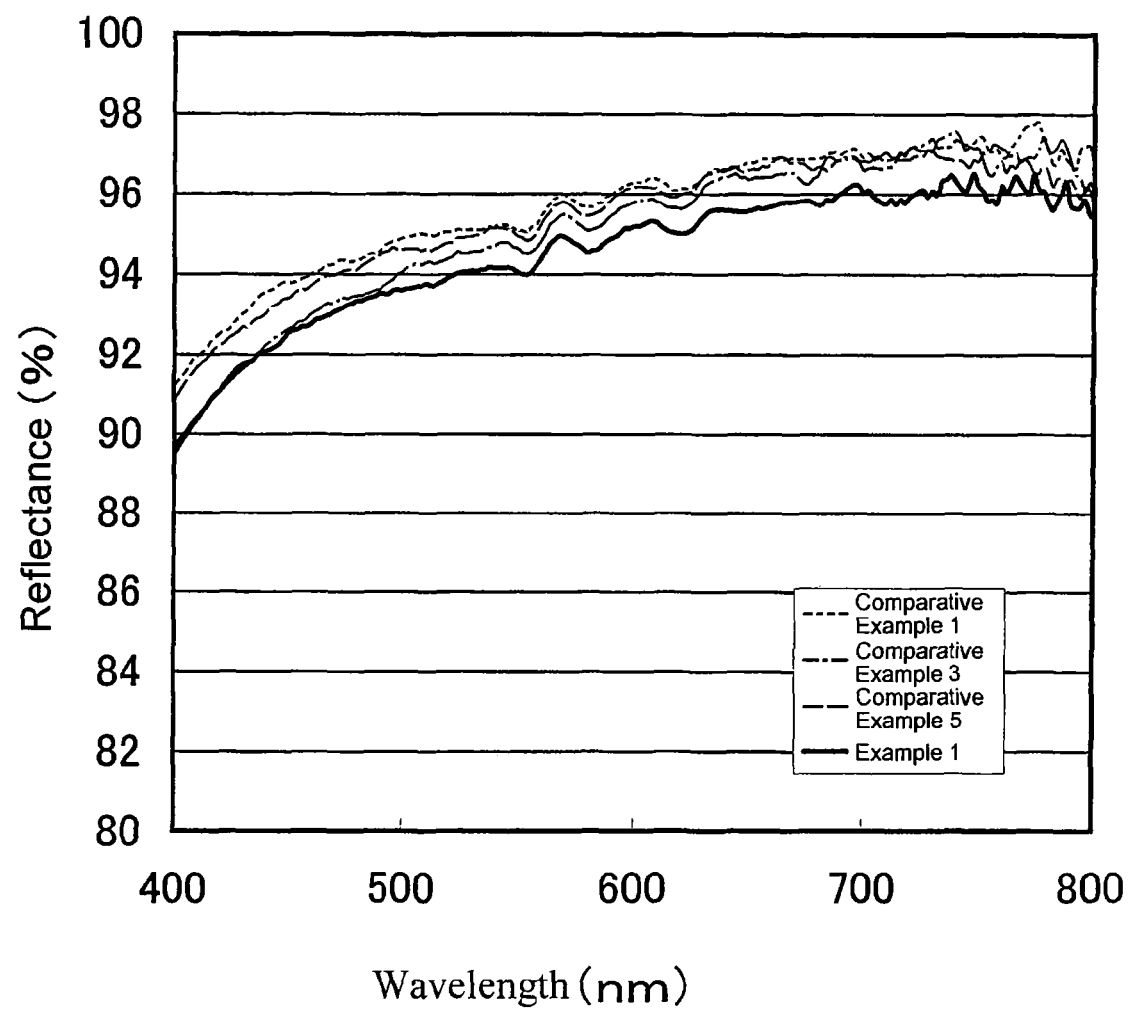
FIG. 5 is a graph showing the result of a comparison between the reflecting spectrums obtained in Example 1 and Comparative Examples 1, 3 and 5.

A silver alloy sputtering target material composed of 98.7 Ag-0.8 Pd-0.3 Cu-0.2 Ge (this means that Ag content: 98.7 wt %, Pd content: 0.8 wt %, Cu content: 0.3 wt %, Ge content: 0.2 wt %, hereinafter, the composition of the silver alloy will be shown by this notation) was produced according to the method described in the embodiment. Using this silver alloy sputtering target material, a silver alloy reflecting film having the above composition was formed on a quartz glass substrate having a smooth surface by a sputtering method as Example 1. The thickness of the film was 200 nm. An AFM (Atomic Force Microscope, manufactured by Seiko Instruments Inc., Model No. SPA300HV) image of the formed thin film is shown in FIG. 4(a). At this time, the results of surface roughness analysis are as follows: Ra (nm): 1.410, RMS (nm): 1.785 and P-V (nm): 14.07. Also, the reflectance of the silver alloy thin film of Example 1 was measured by a spectrophotometer (manufactured by Shimadzu Corporation, Model No. UV-3100 PC). The range of the used wavelength was set to 400 to 800 nm. The results are shown in FIG. 5.

Example 2

The silver alloy thin film of Example 1 was subjected to heat treatment carried out at 250° C. for one hour in the air. The resulting sample was obtained as Example 2. The silver alloy thin film of Example 2 was also observed by an AFM in the same manner as in Example 1. The obtained AFM image is shown in FIG. 6(a). At this time, the results of surface roughness analysis were as follows: Ra (nm): 1.693, RMS (nm): 2.203 and P-V (nm): 24.55. Also, the reflectance of the silver alloy thin film of Example 2 was measured in the same manner as in Example 1. The results are shown in FIG. 7.

Comparative Example 1

A silver alloy sputtering target material composed of 99.2 Ag-0.8 Pd was produced according to the method described in the embodiment. Using this silver alloy sputtering target material, a silver alloy reflecting film having the above composition was formed on a quartz glass substrate having a smooth surface by a sputtering method as Comparative Example 1. The thickness of the film was 200 nm. An AFM image of the thin film formed in the same manner as in Example 1 is shown in FIG. 4(b). At this time, the results of surface roughness analysis were as follows: Ra (nm): 6.265, RMS (nm): 8.447 and P-V (nm): 64.31. Also, the reflectance of the silver alloy thin film of Comparative Example 1 was measured. The results are shown in FIG. 5.

Comparative Example 2

The silver alloy thin film of Comparative Example 1 was subjected to heat treatment carried out at 250° C. for one hour in the air. The resulting sample was obtained as Comparative Example 2. The silver alloy thin film of Comparative Example 2 was also observed by an AFM in the same manner as in Example 1. The obtained AFM image is shown in FIG. 6(b). At this time, the results of surface roughness analysis were as follows: Ra (nm): 6.265, RMS (nm): 8.447 and P-V (nm): 64.31. Also, the reflectance of the silver alloy thin film of Comparative Example 2 was measured in the same manner as in Example 1. The results are shown in FIG. 7.

Comparative Example 3

A silver alloy sputtering target material composed of 98.9 Ag-0.8 Pd-0.3 Cu was produced according to the method described in the embodiment. Using this silver alloy sputtering target material, a silver alloy reflecting film having the above composition was formed on a quartz glass substrate having a smooth surface by a sputtering method as Comparative Example 3. The thickness of the film was 200 nm. An AFM image of the thin film formed in the same manner as in Example 1 is shown in FIG. 4(c). At this time, the results of surface roughness analysis were as follows: Ra (nm): 1.533, RMS (nm): 1.977 and P-V (nm): 16.98. Also, the reflectance of the silver alloy thin film of Comparative Example 3 was measured. The results are shown in FIG. 5.

Comparative Example 4

The silver alloy thin film of Comparative Example 3 was subjected to heat treatment carried out at 250° C. for one hour in the air. The resulting sample was obtained as Comparative Example 4. The silver alloy thin film of Comparative Example 4 was also observed by an AFM in the same manner as in Example 1. The obtained AFM image is shown in FIG. 6(c). At this time, the results of surface roughness analysis were as follows: Ra (nm): 2.034, RMS (nm): 2.850 and P-V (nm): 35.85. Also, the reflectance of the silver alloy thin film of Comparative Example 4 was measured in the same manner as in Example 1. The results are shown in FIG. 7.

Comparative Example 5

A silver alloy sputtering target material composed of 99.0 Ag-0.8 Pd-0.2 Ge was produced according to the method described in the embodiment. Using this silver alloy sputtering target material, a silver alloy reflecting film having the above composition was formed on a quartz glass substrate having a smooth surface by a sputtering method as Comparative Example 5. The thickness of the film was 200 nm. An AFM image of the thin film formed in the same manner as in Example 1 is shown in FIG. 4(d). At this time, the results of surface roughness analysis were as follows: Ra (nm): 1.794, RMS (nm): 2.280 and P-V (nm): 21.16. Also, the reflectance of the silver alloy thin film of Comparative Example 5 was measured. The results are shown in FIG. 5.

Comparative Example 6

The silver alloy thin film of Comparative Example 5 was subjected to heat treatment carried out at 250° C. for one hour in the air. The resulting sample was obtained as Comparative Example 6. The silver alloy thin film of Comparative Example 6 was also observed by an AFM in the same manner as in Example 1. The obtained AFM image is shown in FIG. 6(d). At this time, the results of surface roughness analysis were as follows: Ra (nm): 8.794, RMS (nm): 11.80 and P-V (nm): 83.98. Also, the reflectance of the silver alloy thin film of Comparative Example 6 was measured in the same manner as in Example 1. The results are shown in FIG. 7.

The heat resistance of the silver alloy can be evaluated by making comparison between Examples 1 and 2 and Comparative Examples 1 to 6. First, the fine structure is evaluated based on the comparison made between the AFM images of the formed reflecting films each obtained in Example 1 and Comparative Examples 1, 3 and 5 with reference to FIG. 4. It is clear that the size of crystal grains of the silver alloy thin film is larger in Comparative Example 1 that is a two-element system. The crystals obtained in the remaining three examples are all fine and the results of the surface roughness analysis reveals that the size of crystals are finer in the order of Example 1, Comparative Example 3 and Comparative Example 5. On the other hand, when the reflectances of Example 1 and Comparative Examples 1, 3 and 5 are compared with each other with reference to FIG. 5, a difference between the highest reflectance (Comparative Example 1) and the lowest reflectance (Example 1) is 1 to 2% at most. The reflectance tends to be higher as the content of silver in the silver alloy is increased.

Figure 6:
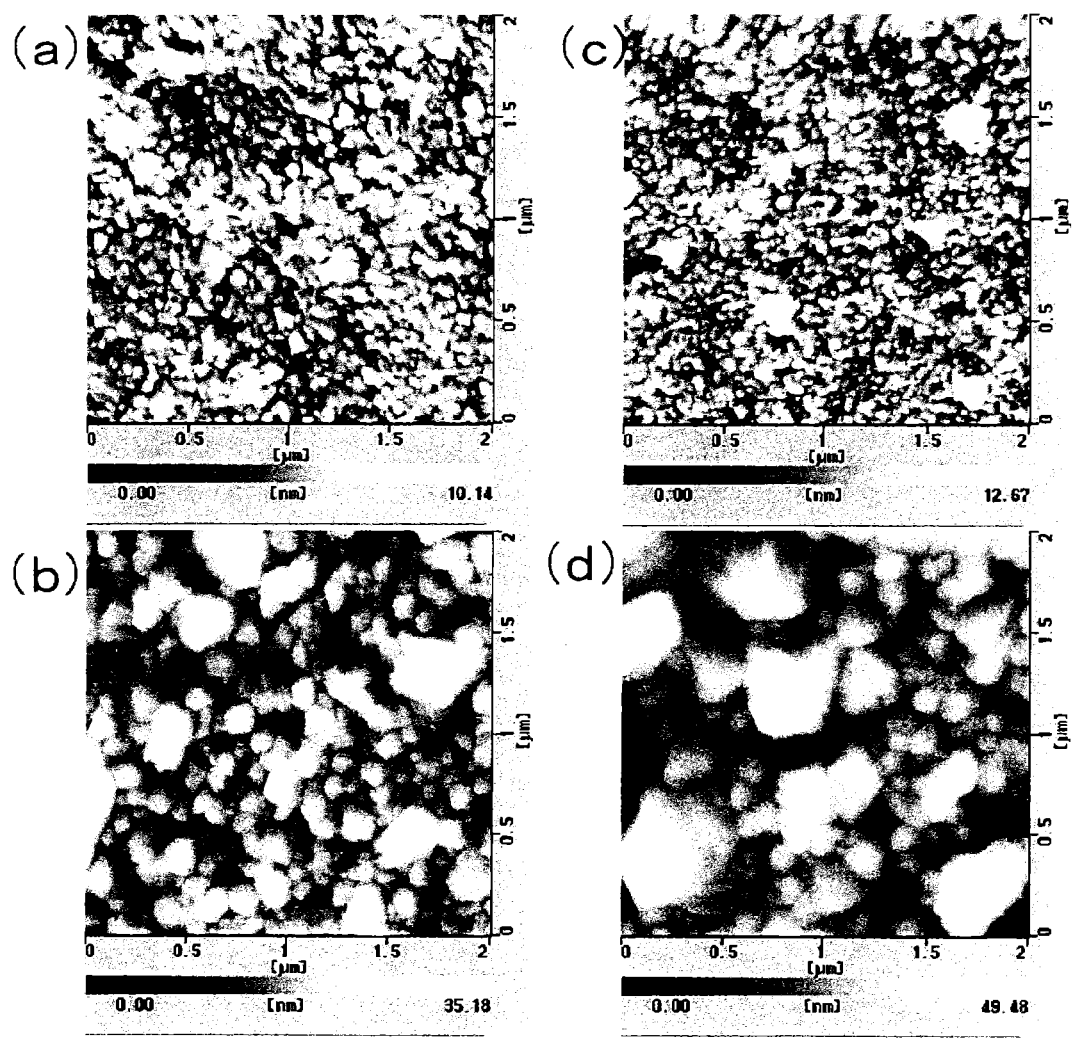
FIG. 6 is a AFM image of a silver alloy thin film after heat treatment carried out at 250° C. for one hour: (a): Example 2, (b): Comparative Example 2, (c): Comparative Example 4, (d): Comparative Example 6.
Figure 7:
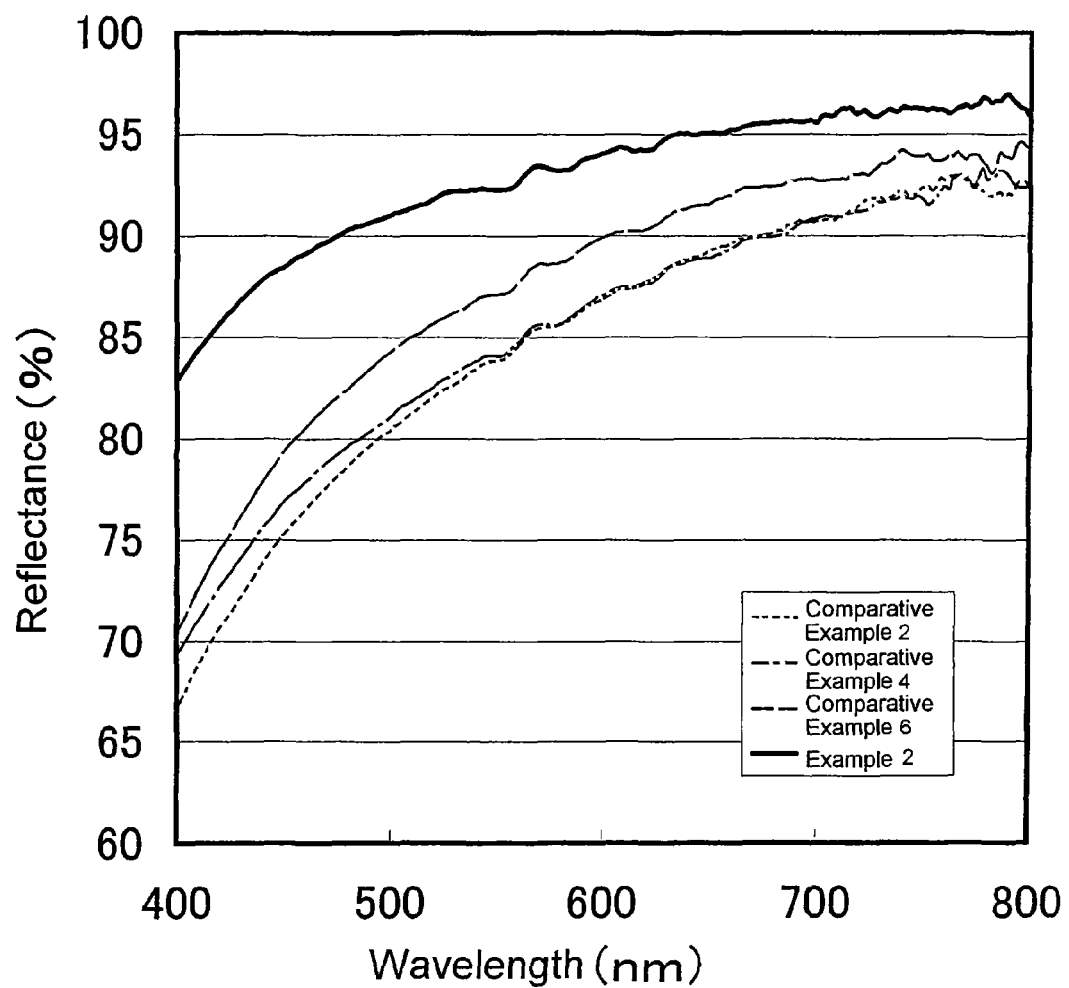
FIG. 7 is a graph showing the result of a comparison between the reflecting spectrums obtained in Example 2 and Comparative Examples 2, 4 and 6.

Next, the fine structure is evaluated based on the comparison made between the AFM images of the reflecting films after heat-treated each obtained in Example 2 and Comparative Examples 2, 4 and 6 with reference to FIG. 6. It is clear that the size of crystal grains of the silver alloy thin film is larger in Comparative Examples 6 and 2, which shows that particles are grown by heating. In Comparative Example 4, slight growth of particles is observed and only a part of particles are grown in a tall and columnar form. The highly luminous part of the AFM image of FIG. 6(b) shows the particles grown in a tall and columnar form. On the other hand, growth of particles is not almost observed in Example 2. It is found that the result of the surface roughness analysis and the degree of growth of particles observed visually from the AFM image are correlated. On the other hand, reflectances of Example 2 and Comparative Examples 2, 4 and 6 will be compared. When Comparative Examples 2, 4 and 6 are compared with Comparative Examples 1, 3 and 5 that are before heat-treated respectively, the reflectance is dropped, for example, by as large as 21 to 25% at a wavelength of 400 nm. When Example 2 is compared with Example 1, on the other hand, a reduction in reflectance due to heat treatment is about 7%. Therefore, Example 2 has a reflectance 13 to 17% higher than Comparative Example 2, 4 or 6 at a wavelength of 400 nm.

The following fact is clarified from a comparison between Examples 1 and 2 and Comparative Examples 1 to 6. When Cu, Ge or Cu—Ge is added to a Ag—Pd system, particle micronization in the thin film can be attained in the case of adding any one of the above metals. Though the addition of Cu suppresses the particle growth caused by heating, it has not reached the stage where the growth of large columnar crystals grown locally is restrained. On the other hand, the addition of Ge gives rise to the particle growth caused by heating. However, the addition of Cu—Ge suppresses both the particle growth caused by heating and the growth of the columnar crystals. When Ge is added, the particle growth is caused whereas when Cu and Ge are added simultaneously, the particle growth and the growth of the columnar crystals are both restricted. Though this reason is not clear, it is inferred that the aforementioned effect of suppressing the particle growth is obtained more greatly in the case of adding Cu and Ge simultaneously than in the case of adding any one of Cu and Ge. Further, when comparing FIG. 5 with FIG. 7, the reason why Example 2 still keeps a high reflectance even after such the heat treatment is considered to be that the growth of the surface roughness of the reflecting film and the occurrence of hillocks are prevented. Also, when Examples 2 and Comparative Examples 2, 4 and 6 are observed visually, Comparative Examples 2, 4 and 6 are somewhat sulfurized, causing yellowing, whereas Example 2 is not colored. It is therefore inferred that Example 2 maintains a high reflectance because not only the growth of the surface roughness of the reflecting film and the occurrence of hillocks are suppressed but also the Ag—Pd—Cu—Ge type silver alloy is not sulfurized even after heat treatment. This is considered to be primarily due to the effect of the addition of Ge.

Next, the Ag—Pd—Cu—Ge type silver alloy was evaluated as to heat resistance and reflectance as a factor in change of Ge content.

Example 3

A silver alloy sputtering target material composed of 98.4 Ag-0.8 Pd-0.3 Cu-0.5 Ge was produced according to the method described in the embodiment. Using this silver alloy sputtering target material, a silver alloy reflecting film having the above composition was formed on a quartz glass substrate having a smooth surface by a sputtering method. The thickness of the film was 200 nm. The silver alloy thin film was subjected to heat treatment carried out at 250° C. for one hour in the air. The resulting sample was obtained as Example 3. The silver alloy thin film of Example 3 was also observed by an AFM in the same manner as in Example 1. The obtained AFM image is shown in FIG. 8(a). At this time, the results of surface roughness analysis were as follows: Ra (nm): 1.727, RMS (nm): 2.314 and P-V (nm): 28.06. Also, the reflectance of the silver alloy thin film of Example 3 was measured in the same manner as in Example 1. The results are shown in FIG. 9.

Example 4

A silver alloy sputtering target material composed of 97.9 Ag-0.8 Pd-0.3 Cu-1.0 Ge was produced according to the method described in the embodiment. Using this silver alloy sputtering target material, a silver alloy reflecting film having the above composition was formed on a quartz glass substrate having a smooth surface by a sputtering method. The thickness of the film was 200 nm. The silver alloy thin film was subjected to heat treatment carried out at 250° C. for one hour in the air. The resulting sample was obtained as Example 4. The silver alloy thin film of Example 4 was also observed by an AFM in the same manner as in Example 1. The obtained AFM image is shown in FIG. 8(b). At this time, the results of surface roughness analysis were as follows: Ra (nm): 1.252, RMS (nm): 1.656 and P-V (nm): 22.75.

Example 5

A silver alloy sputtering target material composed of 97.4 Ag-0.8 Pd-0.3 Cu-1.5 Ge was produced according to the method described in the embodiment. Using this silver alloy sputtering target material, a silver alloy reflecting film having the above composition was formed on a quartz glass substrate having a smooth surface by a sputtering method. The thickness of the film was 200 nm. The silver alloy thin film was subjected to heat treatment carried out at 250° C. for one hour in the air. The resulting sample was obtained as Example 5. The silver alloy thin film of Example 5 was also observed by an AFM in the same manner as in Example 1. The obtained AFM image is shown in FIG. 8(c). At this time, the results of surface roughness analysis are as follows: Ra (nm): 2.128, RMS (nm): 2.289 and P-V (nm): 22.89.

Comparative Example 4

The AFM image of Comparative Example 4 is shown in FIG. 8(d) for comparison. FIG. 9 shows the reflectance.

Figure 8:
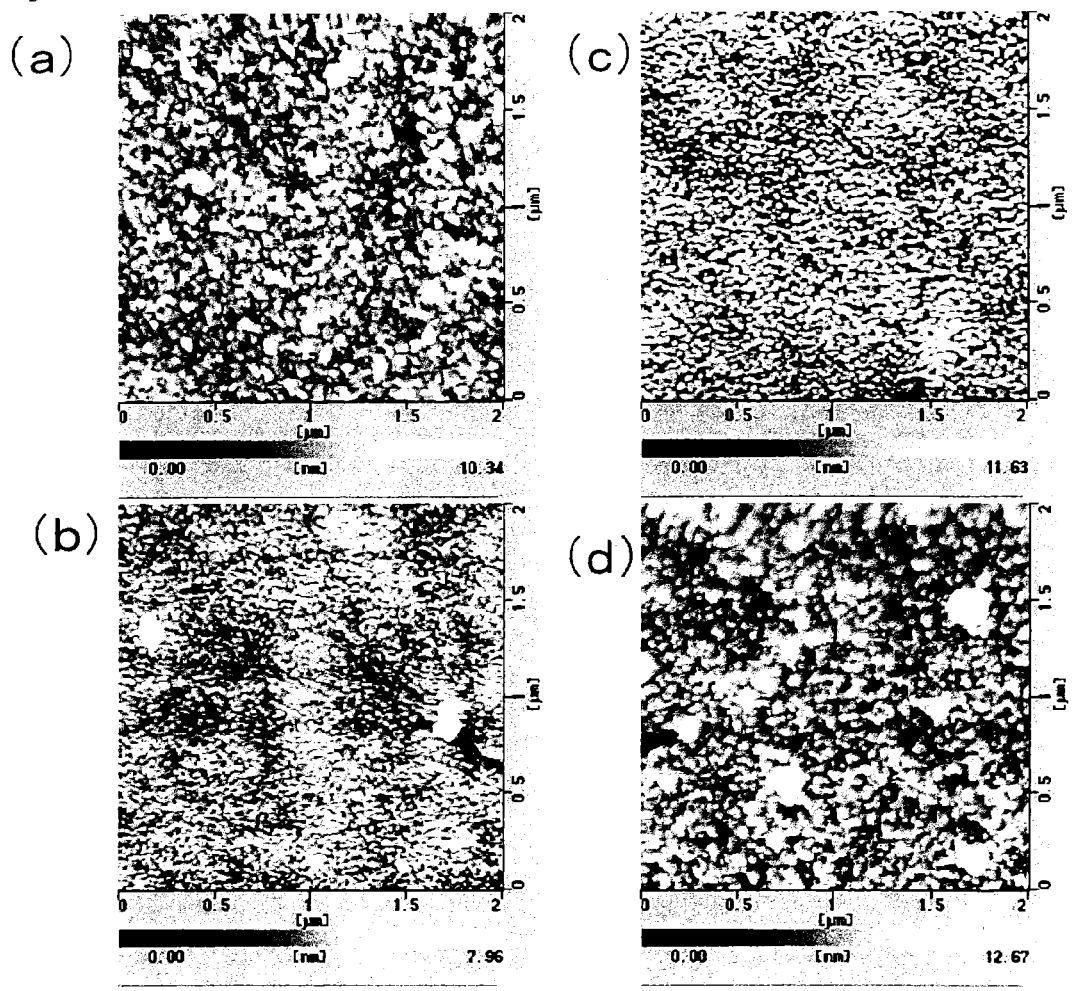
FIG. 8 is a AFM image of a Ag—Pd—Cu—Ge silver alloy thin film after heat treatment carried out at 250° C. for one hour as a factor in change of Ge content: (a): Example 3, (b): Example 4, (c): Example 5, (d): Comparative Example 4.
Figure 9:
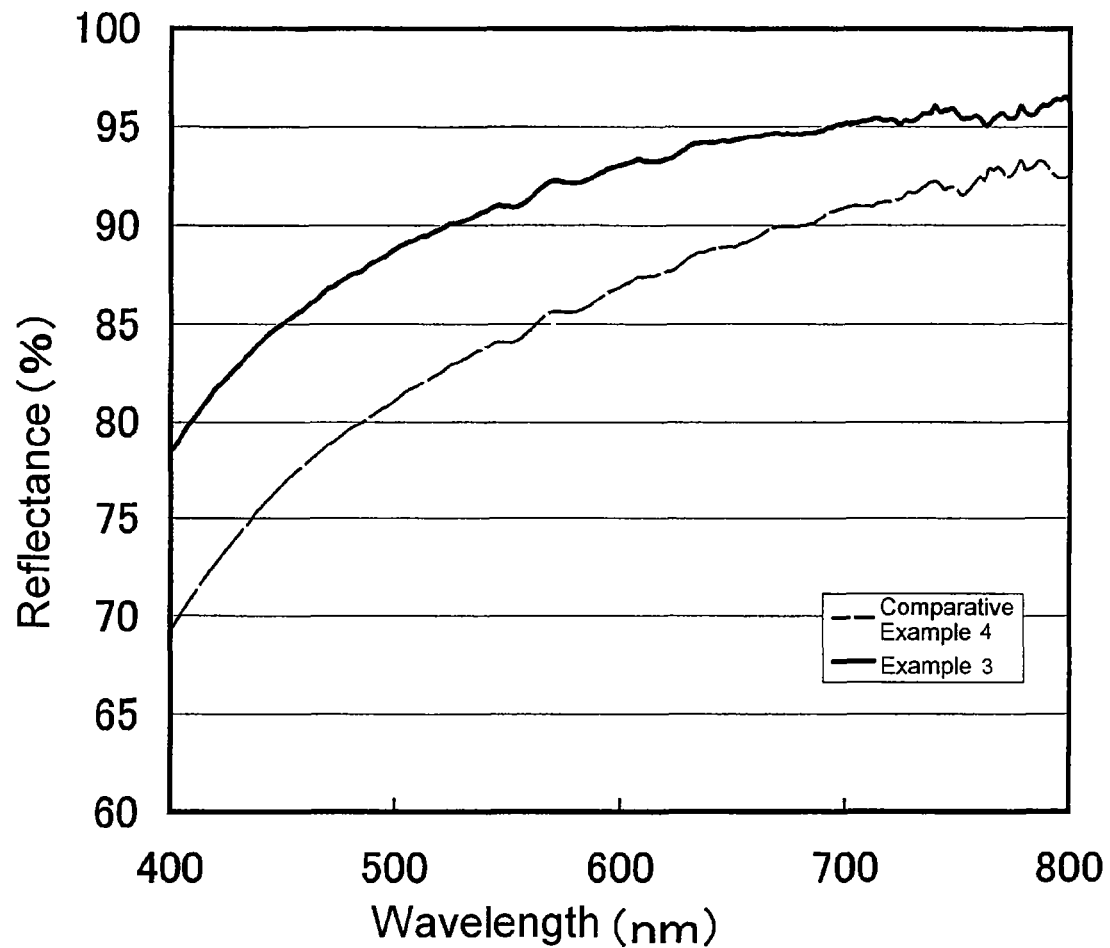
FIG. 9 is a graph showing the result of a comparison between the reflecting spectrums obtained in Example 3 and Comparative Example 4.

On referring to FIG. 8, the growth of columnar grains caused by heat treatment is more suppressed in Examples 3 to 5 than in Comparative Example 4. This is considered to be because the heat resistance is improved by the synergetic action of Cu and Ge. Also, in FIG. 9, Examples 3 has a higher reflectance than Comparative Example 4. This is considered to be because the surface is kept flat owing to an improvement in heat resistance. This is also considered to be because the sulfurization of the reflecting film is suppressed. At this time, it is found by visual observation that Comparative Example 4 is slightly yellowed whereas Examples 3 to 5 are not colored. It is found from the results of FIG. 7 and FIG. 9, the silver alloy thin film according to this embodiment has a reflectance of 90% or more for light having a wavelength of 550 nm after heat-treated at 250° C. for one hour in the air.

Next, the Ag—Pd—Cu—Ge type silver alloy was evaluated as to the resistance thereof to high temperature and high humidity as a factor in change of Ge content.

Example 6

A silver alloy sputtering target material composed of 98.4 Ag-0.8 Pd-0.3 Cu-0.5 Ge was produced according to the method described in the embodiment. Using this silver alloy sputtering target material, a silver alloy reflecting film having the above composition was formed on a quartz glass substrate having a smooth surface by a sputtering method. The thickness of the film was 200 nm. The silver alloy thin film was subjected to high temperature/high humidity treatment carried out at 85° C. under 90% RH for 0.5 hours in the air. The resulting sample was obtained as Example 6. The silver alloy thin film of Example 6 was also observed by an AFM in the same manner as in Example 1. The obtained AFM image is shown in FIG. 10(a). At this time, the results of surface roughness analysis were as follows: Ra (nm): 1.471, RMS (nm): 1.884 and P-V (nm): 20.76.

Example 7

A silver alloy sputtering target material composed of 97.9 Ag-0.8 Pd-0.3 Cu-1.0 Ge was produced according to the method described in the embodiment. Using this silver alloy sputtering target material, a silver alloy reflecting film having the above composition was formed on a quartz glass substrate having a smooth surface by a sputtering method. The thickness of the film was 200 nm. The silver alloy thin film was subjected to high temperature/high humidity treatment carried out at 85° C. under 90% RH for 0.5 hours in the air. The resulting sample was obtained as Example 7. The silver alloy thin film of Example 7 was also observed by an AFM in the same manner as in Example 1. The obtained AFM image is shown in FIG. 10(b). At this time, the results of surface roughness analysis were as follows: Ra (nm): 0.9948, RMS (nm): 1.486 and P-V (nm): 30.55.

Example 8

A silver alloy sputtering target material composed of 97.4 Ag-0.8 Pd-0.3 Cu-1.5 Ge was produced according to the method described in the embodiment. Using this silver alloy sputtering target material, a silver alloy reflecting film having the above composition was formed on a quartz glass substrate having a smooth surface by a sputtering method. The thickness of the film was 200 nm. The silver alloy thin film was subjected to high temperature/high humidity treatment carried out at 85° C. under 90% RH for 0.5 hours in the air. The resulting sample was obtained as Example 8. The silver alloy thin film of Example 8 was also observed by an AFM in the same manner as in Example 1. The obtained AFM image is shown in FIG. 10(c). At this time, the results of surface roughness analysis were as follows: Ra (nm): 0.8017, RMS (nm): 1.016 and P-V (nm): 9.146.

Comparative Example 7

A silver alloy sputtering target material composed of 98.9 Ag-0.8 Pd-0.3 Cu was produced according to the method described in the embodiment. Using this silver alloy sputtering target material, a silver alloy reflecting film having the above composition was formed on a quartz glass substrate having a smooth surface by a sputtering method. The thickness of the film was 200 nm. The silver alloy thin film was subjected to high temperature/high humidity treatment carried out at 85° C. under 90% RH for 0.5 hours in the air. The resulting sample was obtained as Comparative Example 7. The silver alloy thin film of Comparative Example 7 was also observed by an AFM in the same manner as in Example 1. The obtained AFM image is shown in FIG. 10(d). At this time, the results of surface roughness analysis were as follows: Ra (nm): 1.302, RMS (nm): 1.646 and P-V (nm): 14.40.

Figure 10:
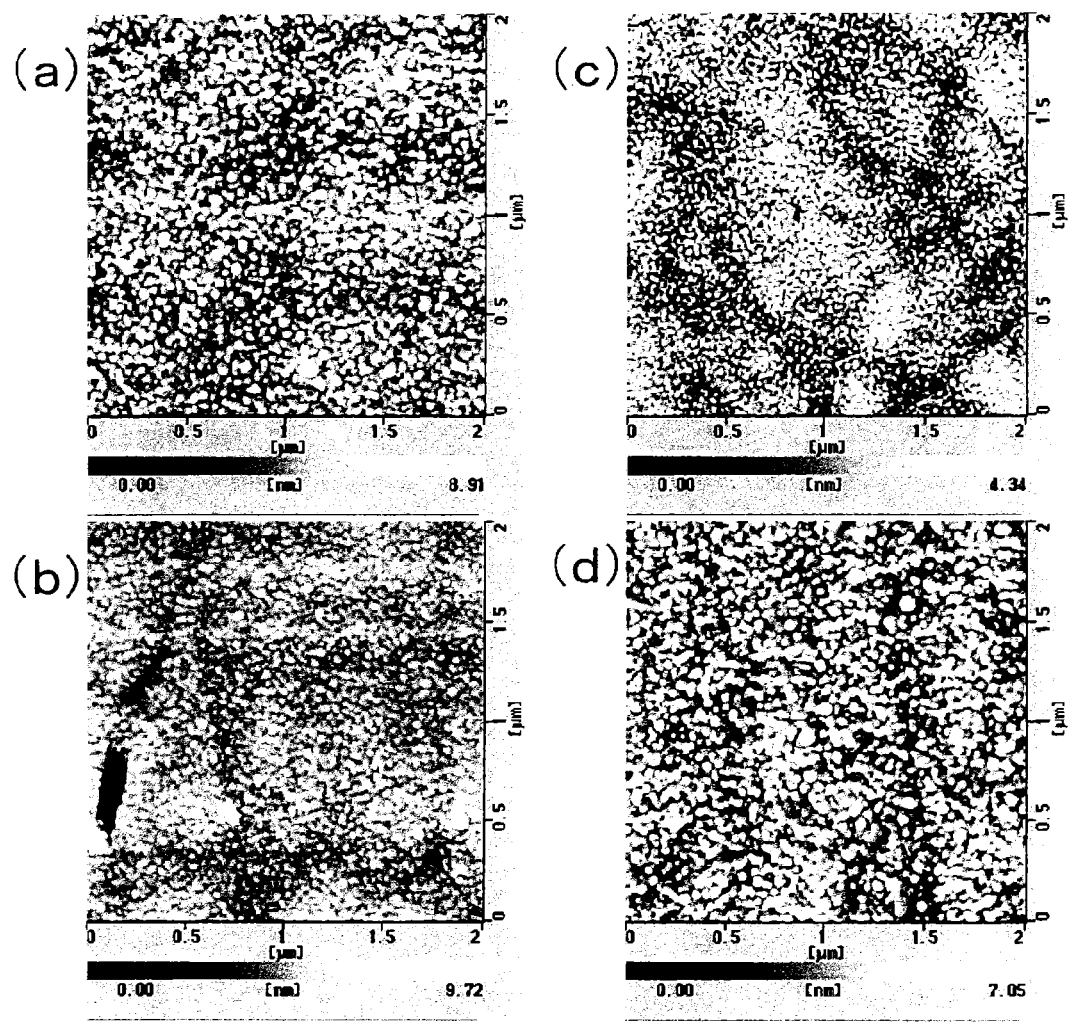
FIG. 10 is a AFM image of a Ag—Pd—Cu—Ge type silver alloy thin film after high temperature and high humidity treatment (85° C., 90% RH, after 30 minutes) as a factor in change of Ge content: (a): Example 6, (b): Example 7, (c): Example 8, (d): Comparative Example 7.

On referring to FIG. 10, particle growth and the growth of columnar grains are not observed under the above high temperature and high humidity condition in Examples 6 to 8 and Comparative Example 7.

Next, the Ag—Pd—Cu—Ge type silver alloy was evaluated as to the resistance thereof to sulfurization as a factor in change of Ge content.

Example 9

The same silver alloy thin film (film thickness: 200 nm) as that of Example 1 was exposed to a 100 ppm hydrogen sulfide atmosphere for 48 hours and then the reflectance of the film was measured. The results are shown in Table 1.

Example 10

A silver alloy sputtering target material composed of 97.9 Ag-0.8 Pd-0.3 Cu-1.0 Ge was produced according to the method described in the embodiment. Using this silver alloy sputtering target material, a silver alloy reflecting film having the above composition was formed on a quartz glass substrate having a smooth surface by a sputtering method as Example 10. The silver alloy thin film (film thickness: 200 nm) of Example 10 was exposed to a 100 ppm hydrogen sulfide atmosphere for 48 hours and then the reflectance of the film was measured. The results are shown in Table 1.

Comparative Example 8

A pure silver thin film (film thickness: 200 nm) was exposed to a 100 ppm hydrogen sulfide atmosphere for 48 hours and then the reflectance of the film was measured. The results are shown in Table 1.

Comparative Example 9

The same silver alloy thin film (film thickness: 200 nm) as that of Comparative Example 3 was exposed to a 100 ppm hydrogen sulfide atmosphere for 48 hours and then the reflectance of the film was measured. The results are shown in Table 1.

As is clear with reference to Table 1, it is found that Examples 9 and 10 containing Ge are superior in resistance to sulfurization and, particularly, Example 10 is reduced in the lowering of reflectance. From the results of Table 1, the silver alloy thin film according to Example 10 has a reflectance exceeding 75% for light having a wavelength of 550 nm after exposed to a 100 ppm hydrogen sulfide atmosphere at ambient temperature for 48 hours.

TABLE 1

| | Reflectance (%) | | | |
|---|---|---|---|---|
| Wavelength | Example 9 | Example 10 | Comparative Example 8 | Comparative Example 9 |
| 700 nm | 63.14 | 87.67 | 27.87 | 29.48 |
| 550 nm | 42.08 | 76.48 | 14.94 | 17.00 |
| 400 nm | 23.31 | 55.18 | 14.32 | 15.27 |

Next, the Ag—Pd—Cu—Ge type silver alloy was evaluated (long-term evaluation) as to the resistance thereof to high temperature and high humidity as a factor in change of Ge content.

Example 11

A silver alloy sputtering target material composed of 98.4 Ag-0.8 Pd-0.3 Cu-0.5 Ge was produced according to the method described in the embodiment. Using this silver alloy sputtering target material, a silver alloy reflecting film having the above composition was formed on a quartz glass substrate having a smooth surface by a sputtering method. The thickness of the film was 200 nm. The silver alloy thin film was subjected to high temperature/high humidity treatment carried out at 85° C. under 90% RH for 200 hours in the air. The resulting sample was obtained as Example 11. The reflectance of the silver alloy thin film of Example 11 was also measured in the same manner as in Example 1. The results are shown in Table 2.

Example 12

A silver alloy sputtering target material composed of 97.9 Ag-0.8 Pd-0.3 Cu-1.0 Ge was produced according to the method described in the embodiment. Using this silver alloy sputtering target material, a silver alloy reflecting film having the above composition was formed on a quartz glass substrate having a smooth surface by a sputtering method. The thickness of the film was 200 nm. The silver alloy thin film was subjected to high temperature/high humidity treatment carried out at 85° C. under 90% RH for 200 hours in the air. The resulting sample was obtained as Example 12. The reflectance of the silver alloy thin film of Example 12 was also measured in the same manner as in Example 1. The results are shown in Table 2.

Example 13

A silver alloy sputtering target material composed of 97.4 Ag-0.8 Pd-0.3 Cu-1.5 Ge was produced according to the method described in the embodiment. Using this silver alloy sputtering target material, a silver alloy reflecting film having the above composition was formed on a quartz glass substrate having a smooth surface by a sputtering method. The thickness of the film was 200 nm. The silver alloy thin film was subjected to high temperature/high humidity treatment carried out at 85° C. under 90% RH for 200 hours in the air. The resulting sample was obtained as Example 13. The reflectance of the silver alloy thin film of Example 13 was also measured in the same manner as in Example 1. The results are shown in Table 2.

Comparative Example 10

A pure silver sputtering target material was produced according to the method described in the embodiment. Using this silver sputtering target material, a silver reflecting film was formed on a quartz glass substrate having a smooth surface by a sputtering method. The thickness of the film was 200 nm. The silver thin film was subjected to high temperature/high humidity treatment carried out at 85° C. under 90% RH for 200 hours in the air. The resulting sample was obtained as Comparative Example 10. The reflectance of the silver thin film was also measured in the same manner as in Example 1. The results are shown in Table 2.

TABLE 2

| | Reflectance (%) | | | |
| --- | --- | --- | --- | --- |
| Wavelength | Example 11 | Example 12 | Example 13 | Comparative Example 10 |
| 700 nm | 95.08 | 93.66 | 92.49 | 75.54 |
| 650 nm | 94.73 | 93.29 | 92.11 | 69.19 |
| 550 nm | 93.03 | 91.25 | 90.11 | 63.69 |
| 400 nm | 84.94 | 83.35 | 82.86 | 58.48 |

As is clear from Table 2, it is found that Examples 11, 12 and 13 containing Ge are superior in weatherability and reduced in the lowering of reflectance. Specifically, it is found that the silver alloy thin film has a reflectance of 90% or more for light having a wavelength of 550 nm after exposed to a high temperature and high humidity atmosphere of 85° C. and 90 RH % for 200 hours. Therefore, the silver alloy thin film according, to this embodiment is suitable as optical disk mediums and reflecting films of headlamps or projector lamps. Also, the silver alloy thin film according to this embodiment is suitable as reflecting films of electronic parts such as LEDs, wiring, electrodes or reflecting electrodes. The silver alloy thin film according to this embodiment is also suitable as electromagnetic wave shielding films.

Next, as to the Ag—Pd—Cu—Ge type silver alloy, the upper limit value of Ge content was examined.

Example 14

Figure 11:
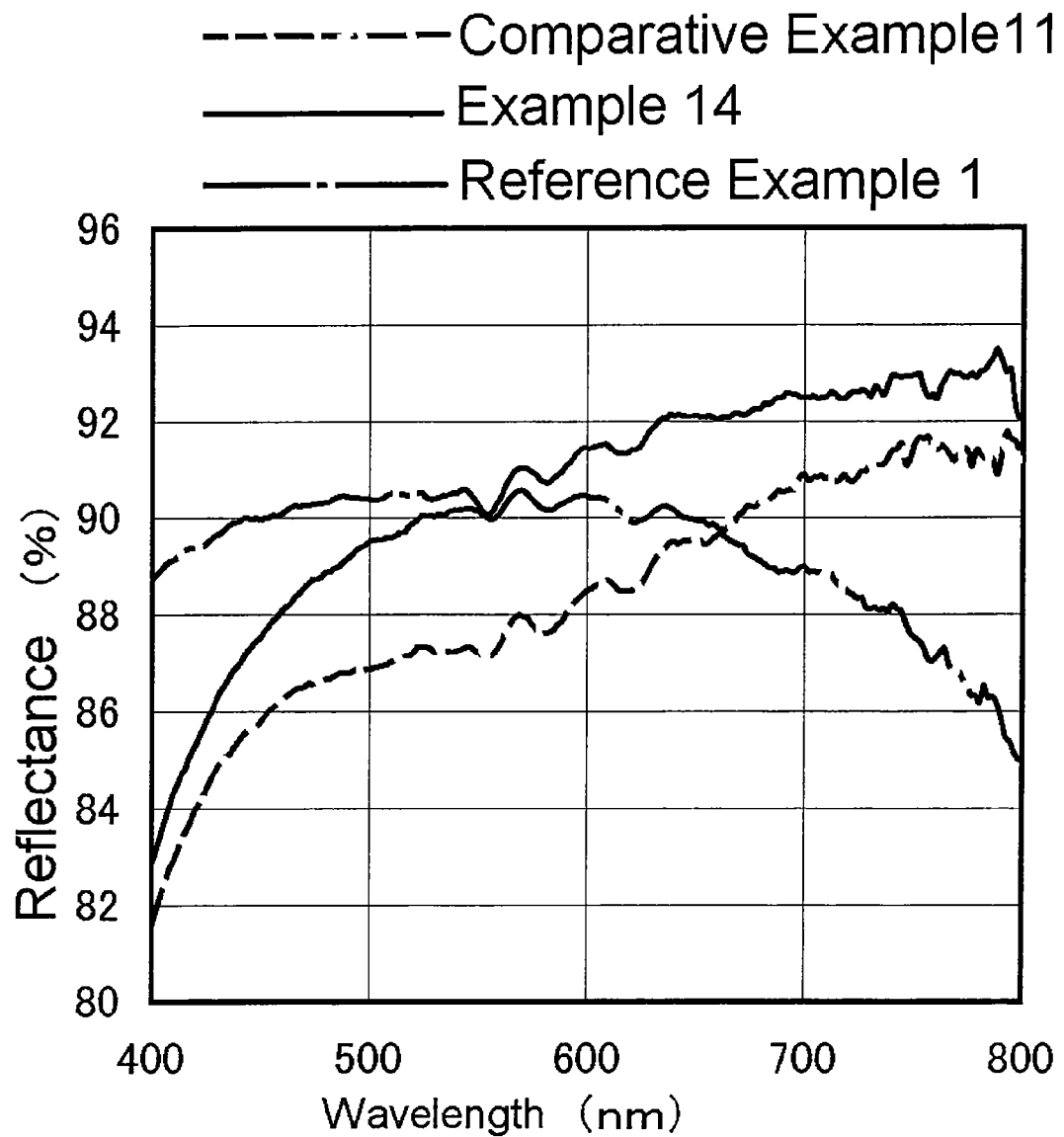
FIG. 11 is a graph showing the result of a comparison between the reflecting spectrums obtained in Example 14, Comparative Example 11 and Reference Example 1.

The same silver alloy thin film as that of Example 13 was prepared and subjected to high temperature and high humidity treatment performed at 85° C. under 90% RH for 200 hours. The resulting sample was obtained as Example 14. The reflectance of the silver alloy thin film was also measured in the same manner as in Example 1. The results are shown in FIG. 11.

Comparative Example 11

The same procedures as in Example 11 were conducted according to the method described in the embodiment except that a silver alloy sputtering target material composed of 97.3 Ag-0.8 Pd-0.3 Cu-1.6 Ge was used. The resulting sample was obtained as Comparative Example 11. The reflectance of the silver alloy thin film was also measured in the same manner as in Example 1. The results are shown in FIG. 11.

Reference Example 1

The same procedures as in Example 14 were conducted except that the sputtering target material was changed to aluminum (100 Al), to obtain an aluminum thin film. This aluminum thin film was subjected to high temperature and high humidity treatment performed at 85° C. under 90% RH for 200 hours. The resulting sample was obtained as Reference Example 1. The reflectance of the thin film was measured in the same manner as in Example 1. The results are shown in FIG. 11.

Comparative Example 11 containing 1.6 wt % of Ge is largely reduced in reflectance by the high temperature and high humidity test made for hours and has a lower reflectance than the aluminum thin film of Reference Example 1 for light having a wavelength of 650 nm which is used to read, for example, the information stored in an optical recording medium. On the other hand, Example 14 containing 1.5 wt % of Ge is reduced in the lowering of reflectance even by the same high temperature and high humidity test and has a higher reflectance than the aluminum thin film of Reference Example 1 for light having a wavelength of 550 nm or more. It is therefore found that the content of Ge in the Ag—Pd—Cu—Ge type silver alloy is preferably 1.5 wt % or less.

Next, the Ag—Pd—Cu—Ge type silver alloy was examined as to its reflectance as a factor of silver content.

Example 15

A silver alloy sputtering target material composed of 98.9 Ag-0.6 Pd-0.3 Cu-0.2 Ge was produced according to the method described in the embodiment. Using this silver alloy sputtering target material, a silver alloy reflecting film having the above composition was formed on a quartz glass substrate having a smooth surface by a sputtering method. The thickness of the film was 200 nm. The silver alloy reflecting film was obtained as Example 15.

Comparative Example 12

A silver alloy thin film was obtained in the same manner as in Example 15 except that the composition of the silver alloy sputtering target material was changed to 95.7 Ag-1.0 Pd-3.0 Cu-0.3 Ge. The silver alloy thin film was obtained as Comparative Example 12.

Comparative Example 13

A silver alloy thin film was obtained in the same manner as in Example 15 except that the composition of the silver alloy sputtering target material was changed to 95.8 Ag-3.0 Pd-1.0 Cu-0.2 Ge. The silver alloy thin film was obtained as Comparative Example 13.

Reference Example 2

An aluminum thin film was obtained in the same manner as in Example 15 except that the sputtering target material was changed to aluminum (100 Al). The aluminum thin film was obtained as Reference Example 2.

Figure 12:
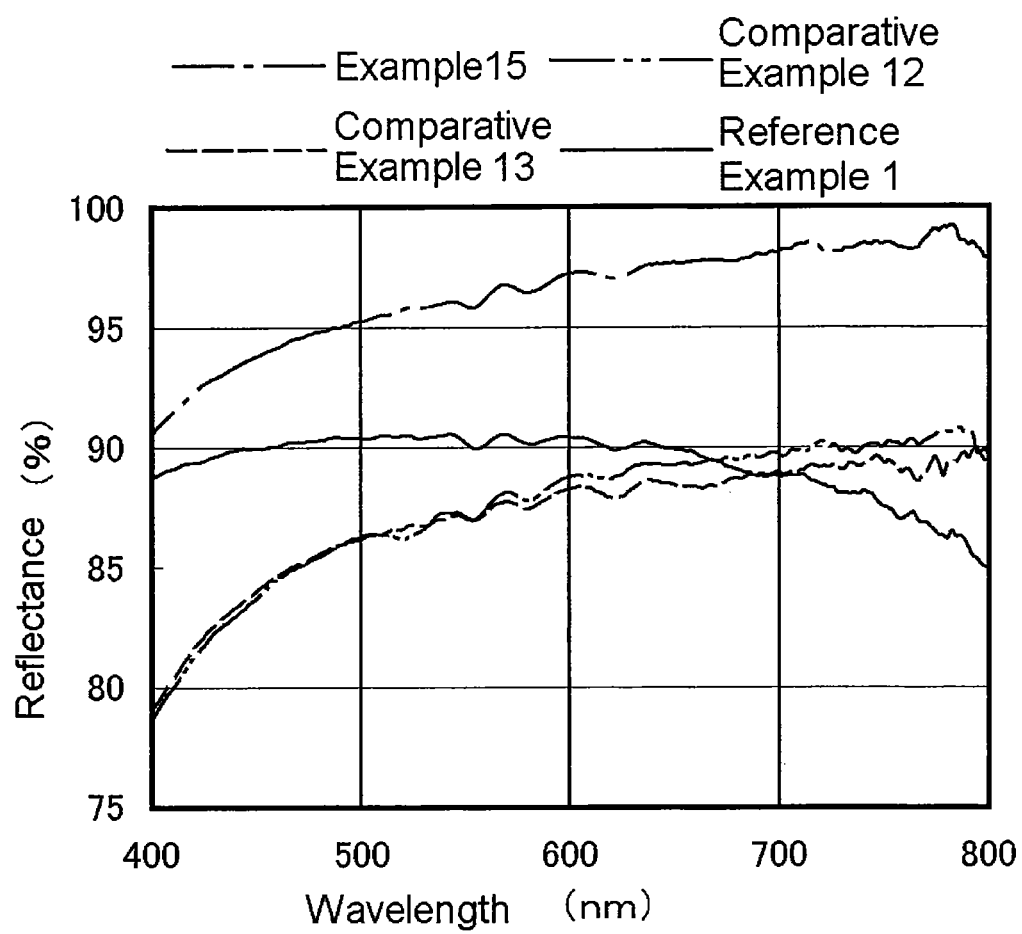
FIG. 12 is a graph showing the result of a comparison between the reflecting spectrums obtained in Example 15, Comparative Example 12, Comparative Example 13 and Reference Example 2.

Each reflectance of the silver alloy thin film and the aluminum thin film was measured in the same manner as in Example 1. The results are shown in FIG. 12. Example 15 exhibited a high reflectance since the content of silver was as high as 98.9% whereas Comparative Examples 12 and 13 respectively exhibited a lower reflectance since the content of silver was less than 97%. Each of these Examples also has a lower reflectance than the aluminum thin film of Reference Example 2 for light having a wavelength of 650 nm. It is found from comparison between Example 15 and Comparative Examples 12 and 13 that the content of silver in the Ag—Pd—Cu—Ge type silver alloy is preferably 97 wt % or more.

Each composition of Examples, Comparative Examples and Reference Examples is collectively described in Table 3.

TABLE 3

| | Composition (wt %) |
|---|---|
| Example 1 | 98.7 Ag-0.8 Pd-0.3 Cu-0.2 Ge |
| Example 2 | 98.7 Ag-0.8 Pd-0.3 Cu-0.2 Ge |
| Example 3 | 98.4 Ag-0.8 Pd-0.3 Cu-0.5 Ge |
| Example 4 | 97.9 Ag-0.8 Pd-0.3 Cu-1.0 Ge |
| Example 5 | 97.4 Ag-0.8 Pd-0.3 Cu-1.5 Ge |
| Example 6 | 98.4 Ag-0.8 Pd-0.3 Cu-0.5 Ge |
| Example 7 | 97.9 Ag-0.8 Pd-0.3 Cu-1.0 Ge |
| Example 8 | 97.4 Ag-0.8 Pd-0.3 Cu-1.5 Ge |
| Example 9 | 98.7 Ag-0.8 Pd-0.3 Cu-0.2 Ge |
| Example 10 | 97.9 Ag-0.8 Pd-0.3 Cu-1.0 Ge |
| Example 11 | 98.4 Ag-0.8 Pd-0.3 Cu-0.5 Ge |
| Example 12 | 97.9 Ag-0.8 Pd-0.3 Cu-1.0 Ge |
| Example 13 | 97.4 Ag-0.8 Pd-0.3 Cu-1.5 Ge |
| Example 14 | 97.4 Ag-0.8 Pd-0.3 Cu-1.5 Ge |
| Example 15 | 98.9 Ag-0.6 Pd-0.3 Cu-0.2 Ge |
| Comparative Example 1 | 99.2 Ag-0.8 Pd |
| Comparative Example 2 | 99.2 Ag-0.8 Pd |
| Comparative Example 3 | 98.9 Ag-0.8 Pd-0.3 Cu |
| Comparative Example 4 | 98.9 Ag-0.8 Pd-0.3 Cu |
| Comparative Example 5 | 99.0 Ag-0.8 Pd-0.2 Ge |
| Comparative Example 6 | 99.0 Ag-0.8 Pd-0.2 Ge |
| Comparative Example 7 | 98.9 Ag-0.8 Pd-0.3 Cu |
| Comparative Example 8 | 100 Ag |
| Comparative Example 9 | 98.9 Ag-0.8 Pd-0.3 Cu |
| Comparative Example 10 | 100 Ag |
| Comparative Example 11 | 97.3 Ag-0.8 Pd-0.3 Cu-1.6 Ge |
| Comparative Example 12 | 95.7 Ag-1.0 Pd-3.0 Cu-0.3 Ge |
| Comparative Example 13 | 95.8 Ag-3.0 Pd-1.0 Cu-0.2 Ge |
| Reference Example 1 | 100 Al |
| Reference Example 2 | 100 Al |

The invention claimed is:

1. A silver alloy consisting essentially of:
   Ag: 97.00 to 99.79 wt %,
   Pd: 0.10 to 2.89 wt %,
   Cu: 0.10 to 2.89 wt %, and
   Ge: 0.01 to 0.50 wt %;
   wherein the silver alloy, after being heat-treated at 250° C., for one hour, in air, has a reflectance of 90% or more for light having a wavelength of 550 nm.

2. The silver alloy according to claim 1, wherein the silver alloy consists of Ag, Pd, Cu and Ge.

3. The silver alloy according to claim 1, wherein the Pd content of the silver alloy is 0.5 to 2.0 wt %.

4. The silver alloy according to claim 1, wherein the Cu content of the silver alloy is 0.20 to 2.0 wt %.

5. The silver alloy according to claim 1, wherein the silver alloy consists essentially of:
   Ag: 97.00 to 99.79 wt %,
   Pd: 0.5 to 2.0 wt %,
   Cu: 0.20 to 2.0 wt %, and
   Ge: 0.01 to 0.50 wt %.

6. The silver alloy of claim 1, wherein the silver alloy is in the form of a sputtering target.

7. The silver alloy of claim 1, wherein the silver alloy is in the form of a silver alloy paste.

8. A silver alloy according to claim 1, wherein the silver alloy consists essentially of:
   Ag: 97.4 to 98.9 wt %,
   Pd: 0.2 to 2.0 wt %,
   Cu: 0.1 to 2.0 wt %, and
   Ge: 0.05 to 0.5 wt %.

9. The silver alloy according to claim 1, wherein the silver alloy consists essentially of:
   Ag: 97.00 to 99.79 wt %,
   Pd: 0.2 to 2.0 wt %,
   Cu: 0.1 to 2.0 wt %, and
   Ge: 0.01 to 0.50 wt %.

10. The silver alloy according to claim 1, wherein the silver alloy consists essentially of:
    Ag: 97.4 to 98.9 wt %,
    Pd: 0.5 to 2.0 wt %,
    Cu: 0.20 to 2.0 wt %, and
    Ge: 0.05 to 0.5 wt %.

11. The silver alloy of claim 1, wherein the silver alloy is in the form of a thin film.

12. The silver alloy of claim 11, wherein the thin film, after heat-treatment at 250° C., for one hour, in air, has a reflectance of 90% or more for light having a wavelength of 550 nm.

13. The silver alloy of claim 11, wherein the thin film, after exposure to a high temperature and high humidity atmosphere of 85° C. and 90 RH % for 200 hours, has a reflectance of 88% or more for light having a wavelength of 550 nm.

14. The silver alloy of claim 11, wherein the thin film is a semi-transmissive film.

15. The silver alloy of claim 11, wherein the thin film is a patterned electrode or wiring.

16. The silver alloy of claim 11, wherein the thin film is a reflecting film.

17. The silver alloy of claim 16, wherein the reflecting film is part of a self-emitting display.

18. The silver alloy of claim 16, wherein the reflecting film is in the form of an electrode.

19. The silver alloy of claim 16, wherein the reflecting film is part of an electronic part.

20. The silver alloy of claim 16, wherein the reflecting film is part of an optical disk.

21. The silver alloy of claim 16, wherein the reflecting film is part of a light.

22. The silver alloy of claim 16, wherein the reflecting film is an electromagnetic shielding film.

23. The silver alloy of claim 16, wherein the reflecting film is part of a flat panel display.

24. A silver alloy consisting essentially of:
Ag: 97.00 to 99.79 wt %,
Pd: 0.10 to 2.89 wt %,
Cu: 0.10 to 2.89 wt %, and
Ge: 0.01 to 0.50 wt %;
wherein the silver alloy, after exposure to a high temperature and high humidity atmosphere of 85° C. and 90 RH %, for 200 hours, has a reflectance of 88% or more for light having a wavelength of 550 nm.

* * * * *